United States Patent
Chen et al.

(10) Patent No.: US 11,215,642 B2
(45) Date of Patent: Jan. 4, 2022

(54) ELECTRONIC TEST DEVICE

(71) Applicant: WINWAY TECHNOLOGY CO., LTD., Kaohsiung (TW)

(72) Inventors: Kuan-Chung Chen, Kaohsiung (TW); Cheng-Hui Lin, Kaohsiung (TW); Kuan-Yu Chen, Kaohsiung (TW)

(73) Assignee: WINWAY TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/808,793

(22) Filed: Mar. 4, 2020

(65) Prior Publication Data
US 2021/0278440 A1    Sep. 9, 2021

(51) Int. Cl.
  *G01R 1/073*    (2006.01)
(52) U.S. Cl.
  CPC ................ *G01R 1/07371* (2013.01)
(58) Field of Classification Search
  CPC ........... G01R 1/073; G01R 1/07307; G01R 1/07314; G01R 1/07321; G01R 1/07328; G01R 1/0735; G01R 1/07357; G01R 1/07364; G01R 1/07371; G01R 1/06733; G01R 31/2886; G01R 1/06722; G01R 1/06772; G01R 1/067; G01R 1/06711; G01R 31/2863; H01L 2924/14; H01L 2924/00; H01L 24/72
  See application file for complete search history.

(56) References Cited

U.S. PATENT DOCUMENTS

| | | | | |
|---|---|---|---|---|
| 6,655,983 | B1 * | 12/2003 | Ishikawa | G01R 1/06722 324/755.01 |
| 6,758,682 | B1 * | 7/2004 | Kosmala | H01R 13/2421 439/66 |
| 2012/0315775 | A1 * | 12/2012 | Zhou | G01R 31/2863 439/68 |

FOREIGN PATENT DOCUMENTS

WO    WO-2009102030 A1 *    8/2009    ......... G01R 1/07314

OTHER PUBLICATIONS

English machine translation of Kazama WO-2009102030-A1. (Year: 2009).*

* cited by examiner

*Primary Examiner* — Lee E Rodak
(74) *Attorney, Agent, or Firm* — Muncy, Geissler, Olds & Lowe, P.C.

(57) ABSTRACT

An electronic test device includes a test seat and at least one probe. The test seat has a hole-defining surface that defines a probe hole, and has two positioning sections being proximate respectively to two ends of the probe hole opposite to each other, at least one first protrusion that protrudes inwardly from the at least one positioning sections of the hole-defining surface, and at least one second protrusion that protrudes inwardly from the hole-defining surface between the positioning sections. The at least one probe is positioned in the probe hole. A thickness of each of the at least one first protrusion and the at least one second protrusion ranges from five to thirty percent of a depth of the probe hole.

7 Claims, 7 Drawing Sheets

ELECTRONIC TEST DEVICE

FIELD

The disclosure relates to a test device, and more particularly to an electronic test device.

BACKGROUND

Referring to FIG. 1, a conventional electronic test device 1 is adapted for testing a component 9, and includes a test seat 11 and a plurality of test probes 12. The test seat 11 has a plurality of probe holes 100. Each of the probe holes 100 has a uniform diameter, and receives a respective one of the test probes 12.

To keep up with the trend of miniaturization, such conventional electronic test device 1 may be downsized by narrowing spaces among the probe holes 100, that is, by reducing material of the test seat 11 between every two adjacent probe holes 100. However, such downsizing may affect reliability or validity of the testing since reducing the material between every two adjacent probe holes 100 also reduces flexibility of adapting the probe holes 100 to receive different types of test probes 12, which is crucial to the process of impedance matching. If the impedance matching between the test seat 11 and test probes 12 cannot be achieved, especially for high speed testing under high-frequency ranges, precision and accuracy of the test results may be compromised.

SUMMARY

Therefore, the object of the disclosure is to provide an electronic test device that can alleviate the drawback of the prior art.

According to the disclosure, an electronic test device includes a test seat and at least one probe.

The test seat has at least one seat wall that has a hole-defining surface, at least one first protrusion and at least one second protrusion.

The hole-defining surface defines a probe hole extending in a longitudinal direction, and has two positioning sections being proximate respectively to two ends of the probe hole which are opposite to each other in the longitudinal direction. The at least one first protrusion protrudes inwardly from at least one of the positioning sections of the hole-defining surface. The at least one second protrusion protrudes inwardly from the hole-defining surface, and is disposed between the positioning sections. The at least one probe is positioned in the probe hole of the at least one seat wall.

A thickness of each of the at least one first protrusion and the at least one second protrusion in the longitudinal direction ranges from five to thirty percent of a depth of the probe hole.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
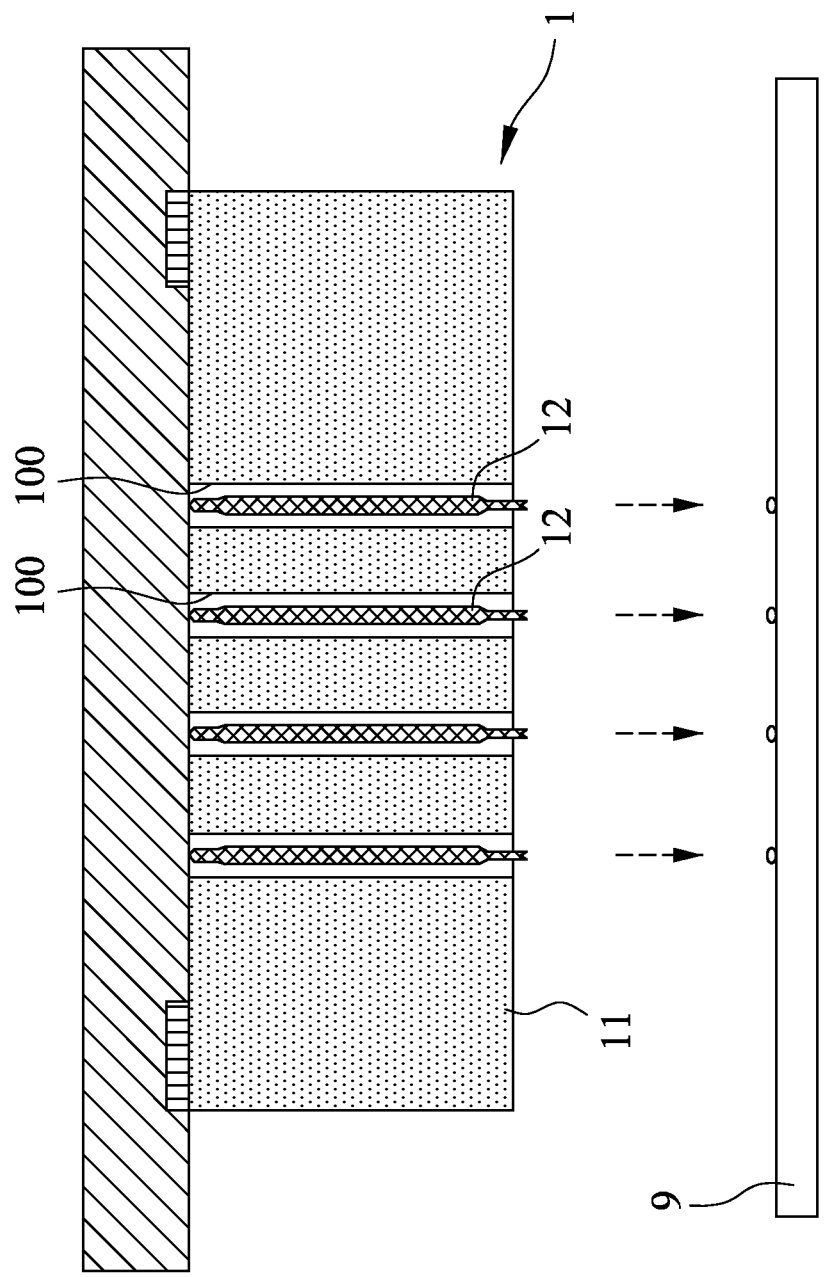
FIG. 1 is a partially sectional schematic view of a conventional electronic test device.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 2:
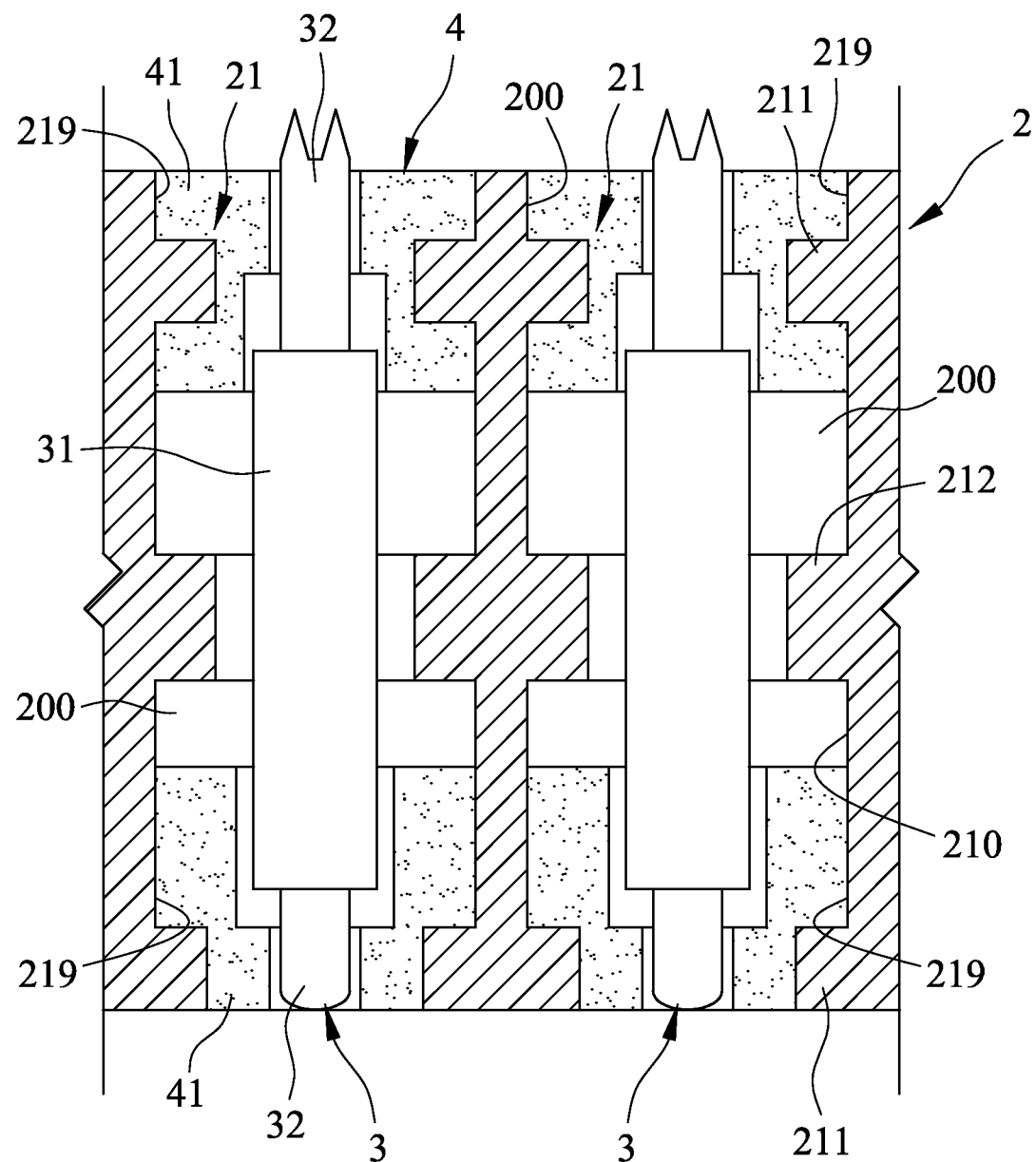
FIG. 2 is a fragmentary partially sectional view of a first embodiment of an electronic test device according to the disclosure.
Figure 3:
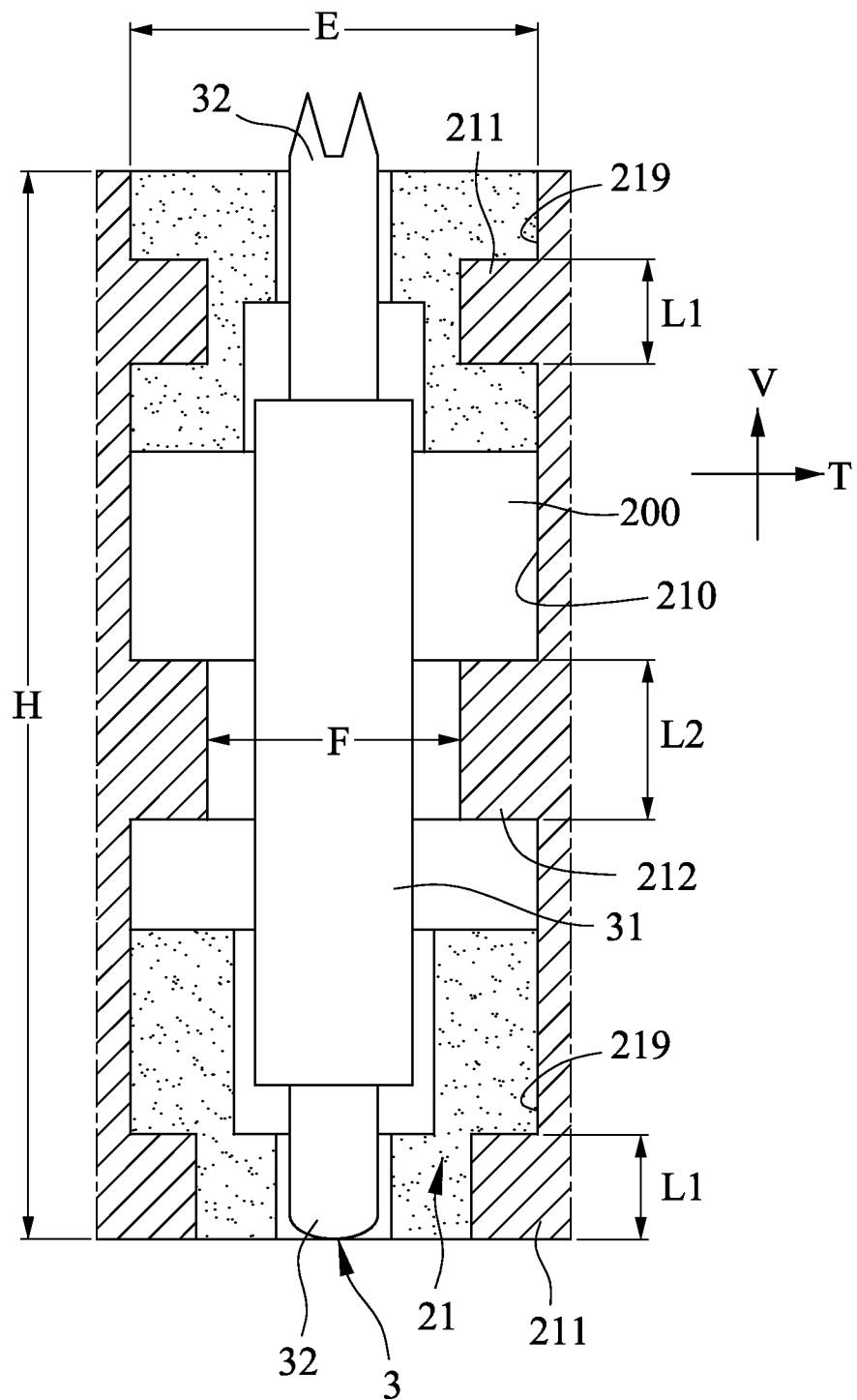
FIG. 3 is another fragmentary partially sectional view of the first embodiment, illustrating a seat wall of a test seat and a probe enclosed by the seat wall.

Referring to FIGS. 2 and 3, a first embodiment of an electronic test device includes a test seat 2, a plurality of probes 3, and a plurality of positioning units 4.

The test seat 2 has a plurality of seat walls 21. Each of the seat walls 21 has a hole-defining surface 210, two first protrusions 211 and a second protrusion 212.

For each of the seat walls 21, the hole-defining surface 210 defines a probe hole 200 extending in a longitudinal direction (V), and has two positioning sections 219 being proximate respectively to two ends of the probe hole 200 which are opposite to each other in the longitudinal direction (V); each of the first protrusions 211 protrudes inwardly from a respective one of the positioning sections 219 of the hole-defining surface 210; and the second protrusion 212 protrudes inwardly from the hole-defining surface 210, and is disposed between the positioning sections 219. The probes 3 are respectively positioned in the probe holes 200 of the seat walls 21.

The second protrusion 212 of each of the seat walls 21 is ring-shaped and surrounds a respective one of the probes 3. A cross section of the second protrusion 212 which is parallel to the longitudinal direction (V) is a rectangle.

Referring to FIG. 3, for each of the seat walls 21 in the present embodiment, a thickness (L1) of each of the first protrusions 211 in the longitudinal direction (V) is sixteen percent of a depth (H) of the probe hole 200; a thickness (L2) of the second protrusion 212 in the longitudinal direction (V) is thirty percent of the depth (H) of the probe hole 200; a distance between the second protrusion 212 and either of the two ends of the probe hole 200 is approximately one-half of the depth (H); and an inner diameter (F) of the second protrusion 212 is sixty percent of a maximum diameter (E) of the probe hole 200. It should be noted that the thickness (L2) of the second protrusion 212 is greater than the thickness (L1) of each of the first protrusions 211.

The probes 3 are enclosed respectively by the seat walls 21 of the test seat 2. Each of the probes 3 includes a main body 31 and two contact members 32 connected to opposite ends of the main body 31 in the longitudinal direction (V).

For each of the probes 3 and a respective one of the seat walls 21, each of the contact members 32 is registered with a respective one of the first protrusions 211 in a transverse direction (T) which is perpendicular to the longitudinal direction (V), and the main body 31 is registered with the second protrusion 212 in the transverse direction (T).

The distribution of the probes 3 corresponds in position to a plurality of electrical contacts of electronic components to be tested (not shown). Thus, when the probes 3 are in contact with the electrical contacts, the electronic components may be tested by signals passing through the probes 3.

It should be noted that the above-mentioned parameters, that is, the thickness (L1, L2) of each of the first protrusions 211 and the second protrusion 212, the inner diameter (F) of the second protrusion 212, and dispositions of the first protrusions 211 and the second protrusion 212 relative to each another, are adjustable for different types of probes 3 to reach impedance matching in the electronic test device under high speed testing.

For example, in variations of the present embodiment, the thickness (L1, L2) of each of the first protrusions 211 and the second protrusion 212 in the longitudinal direction (V) may range from five to thirty percent of the depth (H) of the probe hole 200 of each of the seat walls 21, and the inner diameter (F) of the second protrusion 212 may range from forty to eighty percent of the maximum diameter (E) of the probe hole 200.

Referring again to FIG. 2, each of the positioning units 4 is disposed in the probe hole 200 of one of the seat walls 21 for positioning a respective one of the probes 3 in the probe hole 200, and includes two insulators 41. Specifically, for each of the positioning units 4, the insulators 41 respectively cover the first protrusions 211 of the one of the seat walls 21, and surround the respective one of the probes 3. It should be noted that, so long as the insulators 41 are able to position the probes 3, their configurations (e.g. volumes and dispositions in the probe holes 200) may vary to achieve impedance matching.

Figure 4:
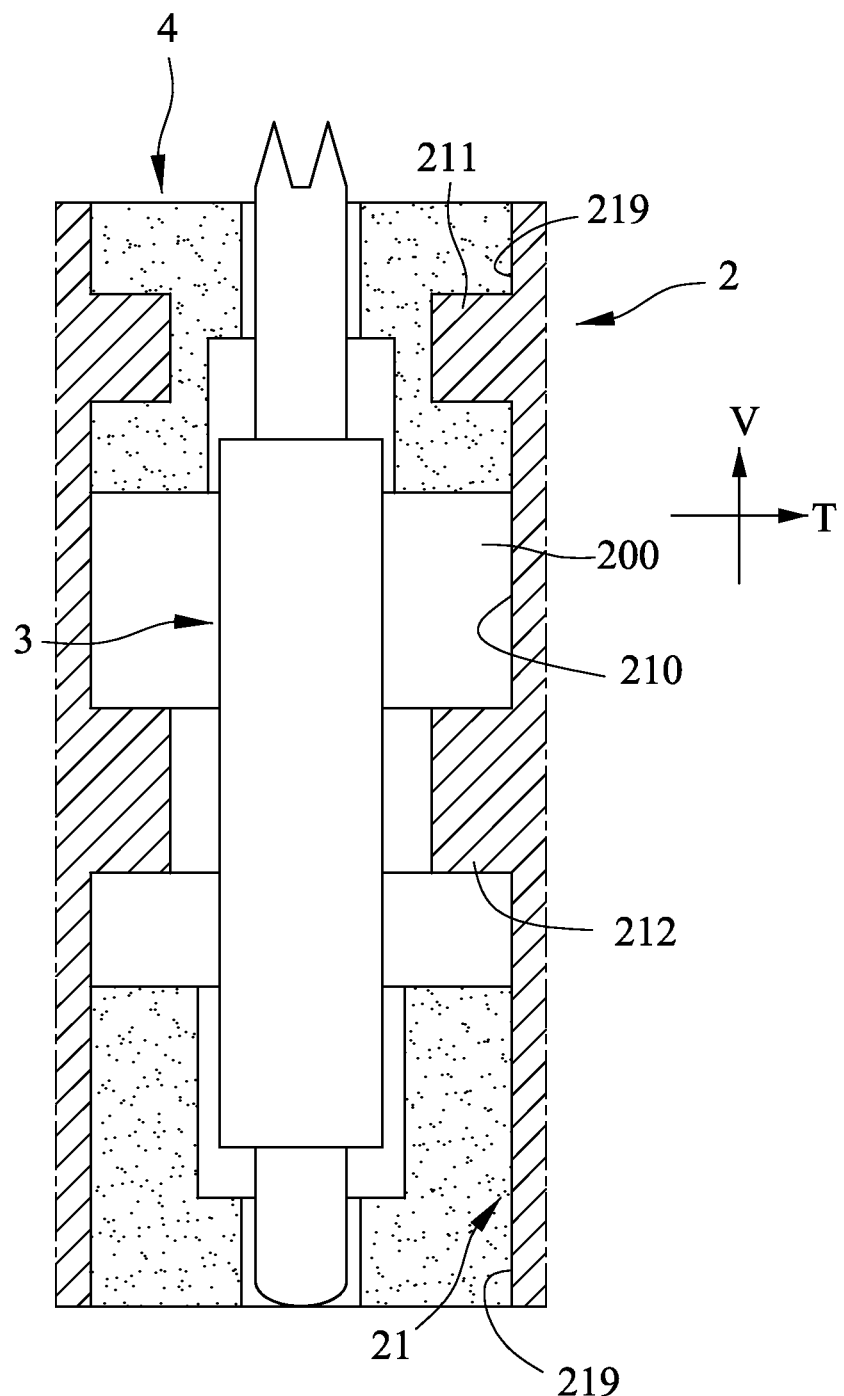
FIG. 4 is a fragmentary partially sectional view of a variation of the first embodiment.

Referring to FIG. 4, in a variation of the first embodiment, each of the seat walls 21 includes only one first protrusion 211 that protrudes inwardly from one of the positioning sections 219 (i.e. the upper one in the perspective of a viewer) of the hole-defining surface 210. However, the first protrusion 211 is not limited to the configuration shown in FIG. 4; in other variations of the embodiment, the first protrusion 211 may protrude inwardly from the other one of the positioning sections 219 (i.e. the lower one in the perspective of a viewer) of the hole-defining surface 210. Such configurations are applicable to certain testing circumstances where a single first protrusion would suffice for adjustment to achieve impedance matching, and save manufacturing cost as well.

Figure 5:
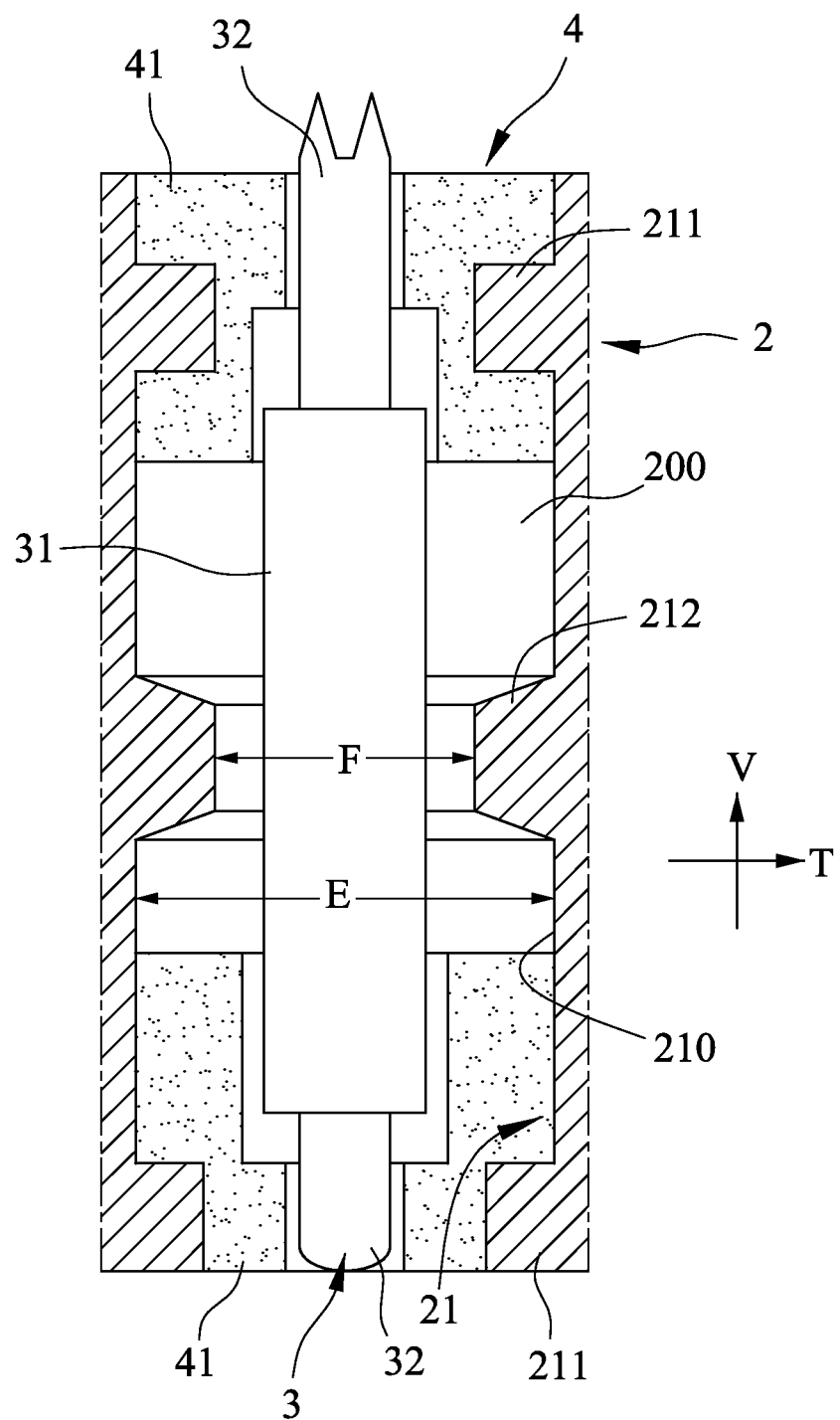
FIG. 5 is a fragmentary partially sectional view of a second embodiment.
Figure 6:
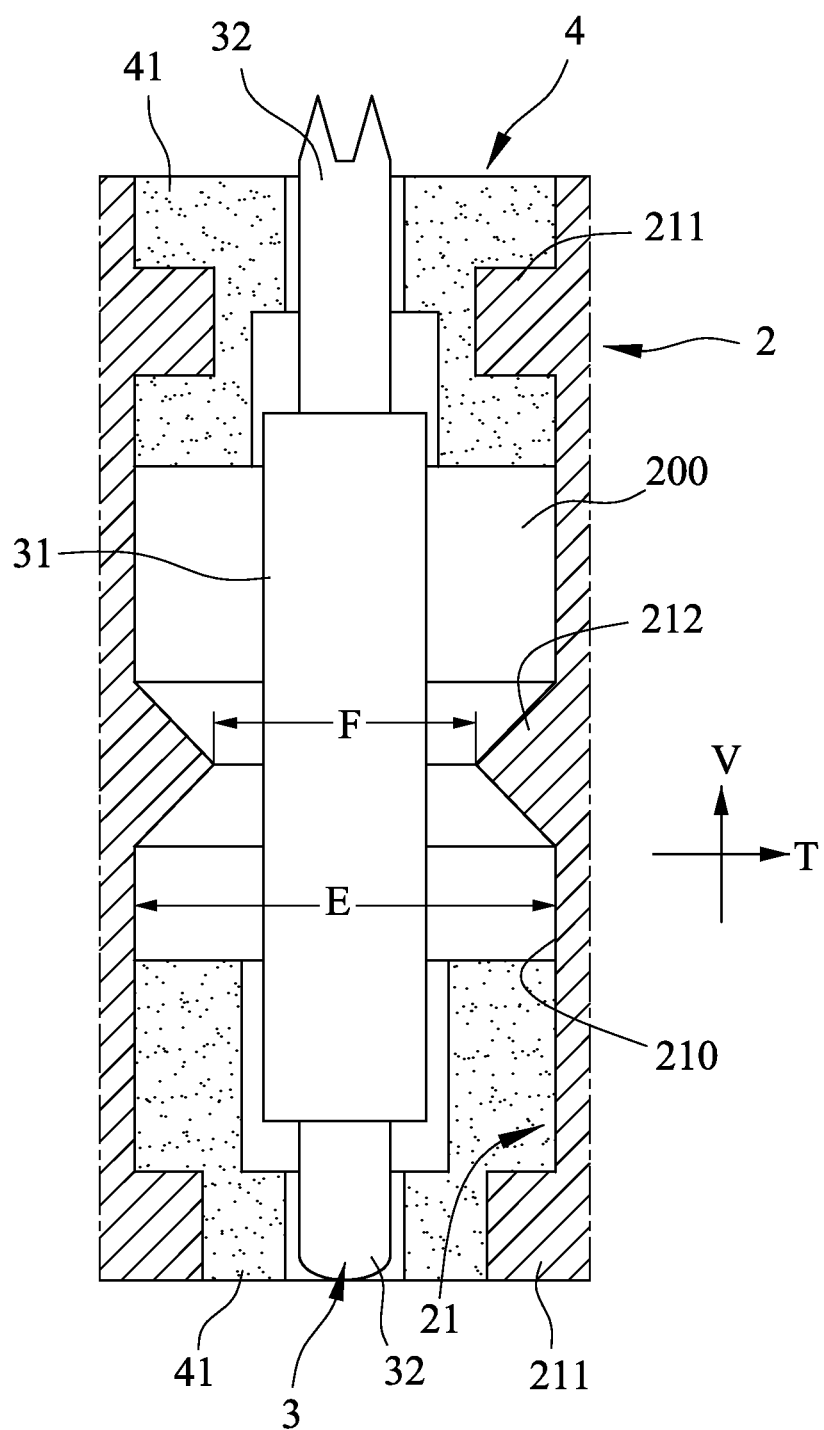
FIG. 6 is a fragmentary partially sectional view of a third embodiment.

Referring to FIGS. 5 and 6, a second embodiment and a third embodiment of the electronic test device according to the disclosure are shown, respectively. The main differences among the three embodiments are described as follows.

In the second embodiment, the second protrusion 212 of each of the seat walls 21 is also ring-shaped and surrounds a respective one of the probes 3, but a cross section of the second protrusion 212 which is parallel to the longitudinal direction (V) is a trapezoid.

In the third embodiment, the second protrusion 212 of each of the seat walls 21 is also ring-shaped and surrounds a respective one of the probes 3; a cross section of the second protrusion 212 which is parallel to the longitudinal direction (V) is a triangle.

In both the second and third embodiments, for each of the seat walls 21, a minimum inner diameter (F) of the second protrusion 212 is sixty percent of the maximum diameter (E) of the probe hole 200 of the seat wall 21. In cases where different types of the probes 3 are adopted, impedance matching may be achieved by changing the configuration of the second protrusion 212 into similar forms as the present embodiments shown in FIGS. 5 and 6.

Figure 7:
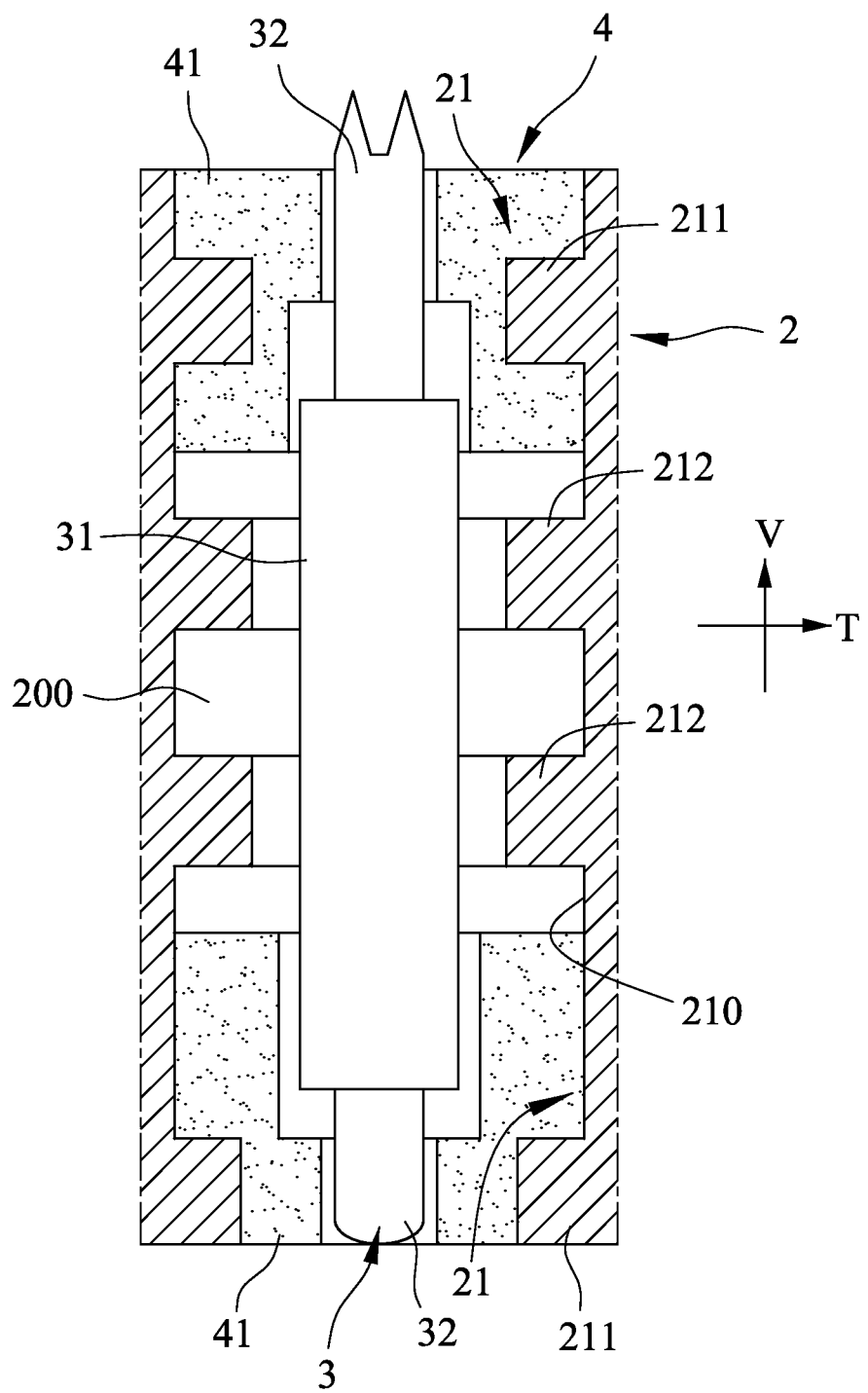
FIG. 7 is a fragmentary partially sectional view of a fourth embodiment.

Referring to FIG. 7, a fourth embodiment of the electronic test device according to the disclosure is shown. The main difference between the present embodiment and the first embodiment resides in that, in the present embodiment, each of the seat walls 21 includes two second protrusions 212 that are spaced apart from each other in the longitudinal direction (V).

It should be noted that the number of the second protrusions 212 is not limited to one or two; in a variation of the present embodiment, each of the seat walls 21 may include three second protrusions 212. In such a manner, the present embodiment provides more flexibility of adjustment for impedance matching in addition to adjusting the parameters mentioned in the first embodiment.

In sum, the electronic test device according to the disclosure has the advantage of increasing adaptability of the test seat 2 to different types of probes where the parameters/configurations of at least one of the first and second protrusions 211, 212 and configurations of the positioning units 4 are adjustable to achieve impedance matching in high speed testing.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An electronic test device comprising:
   a test seat that has
      at least one seat wall having
         a hole-defining surface that defines a probe hole extending in a longitudinal direction, and that has two positioning sections being proximate respectively to two ends of said probe hole which are opposite to each other in the longitudinal direction,
         at least one first protrusion that protrudes inwardly from at least one of said positioning sections of said hole-defining surface, and
         at least one second protrusion that protrudes inwardly from said hole-defining surface and that is disposed between said positioning sections; and
      at least one probe that is positioned in said probe hole;
   wherein a thickness of each of said at least one first protrusion and said at least one second protrusion in the longitudinal direction ranges from five to thirty percent of a depth of said probe hole;

wherein said at least one second protrusion is ring-shaped and surrounds said at least one probe; and wherein a minimum inner diameter of said at least one second protrusion ranges from forty to eighty percent of a maximum diameter of said at least one probe hole so as to prevent electromagnetic interference during high-frequency testing.

2. The electronic test device as claimed in claim 1, wherein:

said at least one probe includes a main body and two contact members connected to opposite ends of said main body in the longitudinal direction;

at least one of said contact members is registered with said at least one first protrusion in a transverse direction which is perpendicular to the longitudinal direction; and said main body is registered with said at least one second protrusion in the transverse direction.

3. The electronic test device as claimed in claim 2, further comprising at least one positioning unit including at least one insulator that is disposed in said probe hole, that covers said at least one first protrusion, and that surrounds said at least one probe.

4. The electronic test device as claimed in claim 1, wherein the thickness of said at least one second protrusion is greater than the thickness of said at least one first protrusion.

5. The electronic test device as claimed in claim 1, wherein a cross section of said at least one second protrusion which is parallel to the longitudinal direction is a rectangle.

6. The electronic test device as claimed in claim 1, wherein a cross section of said at least one second protrusion which is parallel to the longitudinal direction is one of a triangle and a trapezoid.

7. The electronic test device as claimed in claim 1, wherein said at least one second protrusion includes two second protrusions being spaced apart in the longitudinal direction.

* * * * *